United States Patent [19]

Burns

[11] 4,331,740

[45] May 25, 1982

[54] GANG BONDING INTERCONNECT TAPE PROCESS AND STRUCTURE FOR SEMICONDUCTOR DEVICE AUTOMATIC ASSEMBLY

[75] Inventor: Carmen D. Burns, San Jose, Calif.

[73] Assignee: National Semiconductor Corporation, Santa Clara, Calif.

[21] Appl. No.: 140,040

[22] Filed: Apr. 14, 1980

[51] Int. Cl.$^3$ .................. B22F 00/00; H01R 43/00
[52] U.S. Cl. ........................... 428/572; 29/827; 29/576 S; 29/588; 174/52 FP; 357/70
[58] Field of Search ............... 29/827, 577 R, 854, 29/855, 856, 588, 589; 357/69, 70; 174/52 FP; 228/180 A; 428/571, 572, 596, 597

[56] References Cited

U.S. PATENT DOCUMENTS

| | | | |
|---|---|---|---|
| 3,413,713 | 12/1968 | Helda et al. | 174/52 FP X |
| 3,611,061 | 10/1971 | Segerson | 357/70 |
| 3,689,991 | 9/1972 | Aird | 228/180 A X |
| 3,839,782 | 10/1974 | Lincoln . | |
| 4,000,842 | 1/1977 | Burns . | |
| 4,063,993 | 12/1977 | Burns . | |
| 4,099,660 | 7/1978 | Schultz et al. | |
| 4,188,438 | 2/1980 | Burns . | |

Primary Examiner—Francis S. Husar
Assistant Examiner—Carl J. Arbes
Attorney, Agent, or Firm—Gail W. Woodward; James A. Sheridan; Neil B. Schulte

[57] ABSTRACT

A continuous tape is employed in the automatic assembly of semiconductor devices. The tape contains a sequential series of patterns, each one comprising a plurality of metal fingers. Each pattern includes fingers having an inward extension that terminates in a configuration that mates with the contact pattern of the semiconductor device. Desirably these fingers are thermocompression gang bonded to the semiconductor contact pads. This attaches the semiconductor device to the tape for further processing. In one assembly method the fingers have an outward extending portion that is designed for bonding to a secondary structure such as a lead frame destined to become part of the final housing. The fingers in the pattern are joined together by means of a ring located at or near the point at which they are bonded to the lead frame. After the lead frame bonds are achieved, preferably by thermocompression gang bonding, the ring is severed at locations between the fingers. If desired, the ring structure can be weakened at those points where it is to be severed.

9 Claims, 5 Drawing Figures

U.S. Patent
May 25, 1982
4,331,740
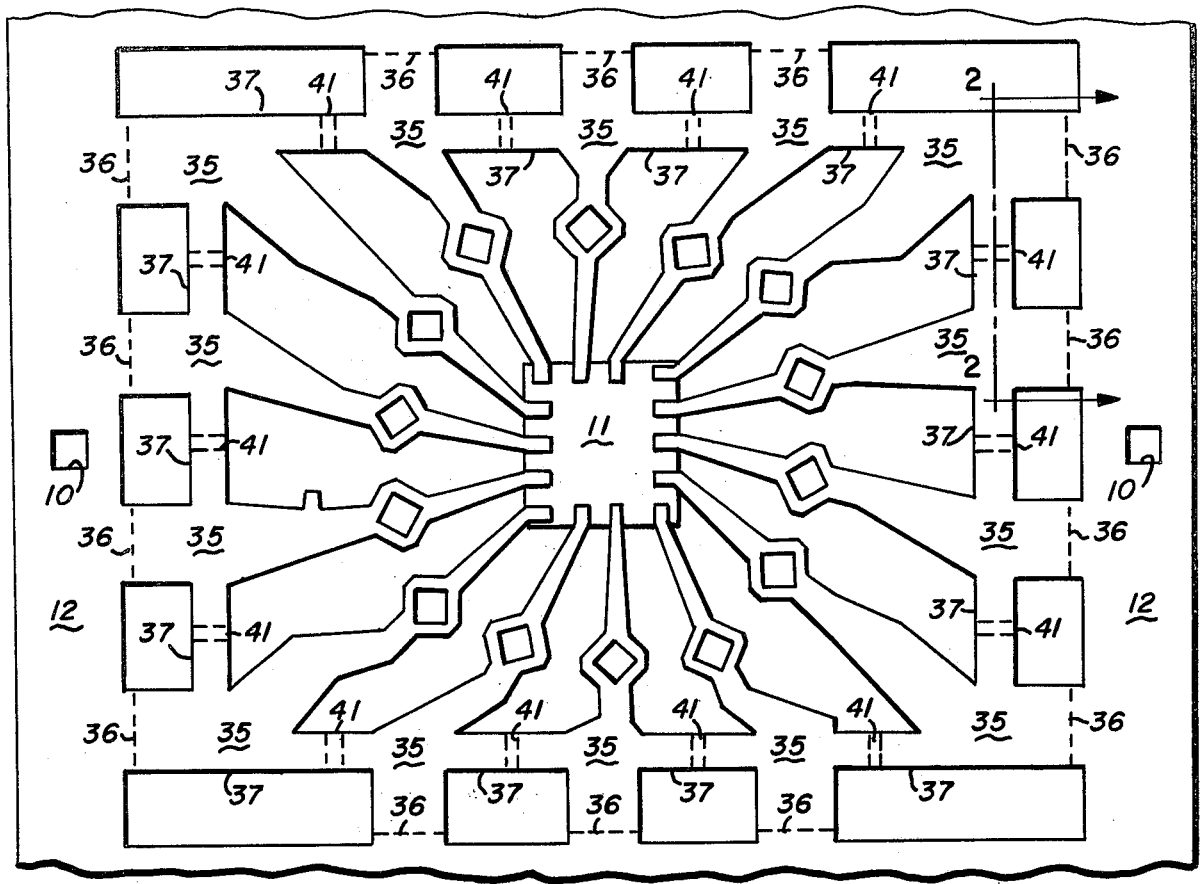
Fig_1
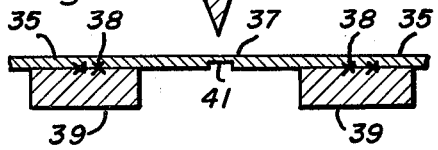
Fig_2
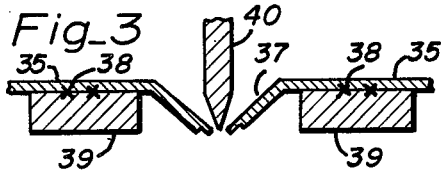
Fig_3
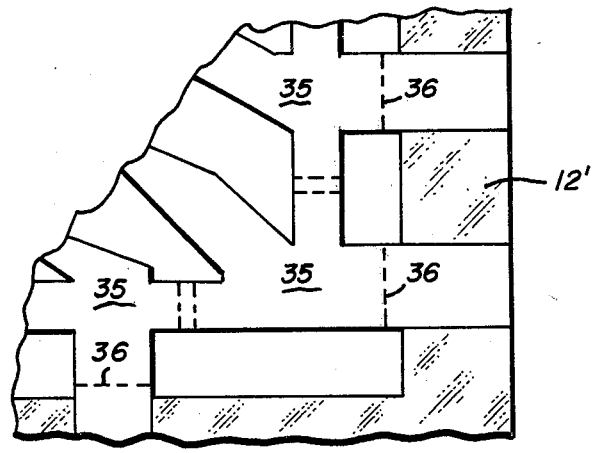
Fig_5
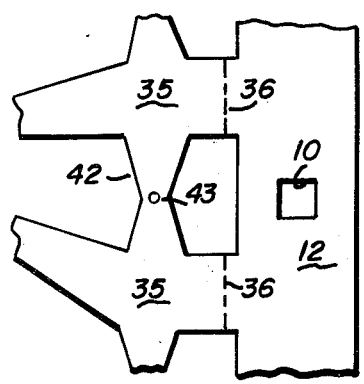
Fig_4

GANG BONDING INTERCONNECT TAPE PROCESS AND STRUCTURE FOR SEMICONDUCTOR DEVICE AUTOMATIC ASSEMBLY

BACKGROUND OF THE INVENTION

The invention relates to the continuous tape assembly of semiconductor devices. Such tapes are either metallic or composite metal insulator film structures. In either case the tape includes a succession of metal finger patterns that have an inner terminal form that mates with the bonding pad pattern on the semiconductor device. My U.S. Pat. No. 4,000,842 details the thermocompression (TC) bonding of copper fingers to a gold structure on a semiconductor device. My U.S. Pat. No. 4,188,438 covers the use of anti-oxidants on copper that is to be TC bonded. My copending patent application Ser. No. 921,642 was filed July 3, 1978 and relates to the use of bumps on the copper tape fingers to provide improved TC bonding without forming bumps on the semiconductor device. My patent application Ser. No. 58,404 was filed July 17, 1979, and relates to a process and machine for producing laminated tape. This is a continuation-in-part of patent application Ser. No. 921,644 which was filed July 3, 1978, and is now abandoned. My copending application Ser. No. 138,030 filed Apr. 7, 1980 titled "LEAD DESIGN FOR SEMICONDUCTOR AUTOMATIC ASSEMBLY TAPE" shows an improved finger structure and its teaching is incorporated herein by reference.

In the assembly process after the semiconductor device is bonded to the tape, the fingers are excised from the tape and bonded to the lead frame. This is done in a high speed thermocompression gang bonder machine. One of the problems encountered in this machine results from displaced fingers which can clog the machine and therefore slow its throughput.

If even one finger is displaced, the machine can become clogged and require shutdown for maintenance. Since the machine runs at a high speed, any downtime can result in substantial loss of production. Thus, it is clear that a very reliable bonding technique must be employed along with some means for immobilizing the fingers.

One useful means for avoiding finger displacement is shown in my U.S. Pat. No. 4,063,993, which discloses the use of insulating rings deposited on the metal stock from which the fingers are constructed. In my U.S. Pat. No. 4,099,660, a plastic film is used to hold the fingers in position while the fingers are formed by translating the chip that is bonded thereto. Both of these approaches involve composite tape materials.

SUMMARY OF THE INVENTION

It is an object of the invention to improve the performance of automatic tape assembly of semiconductor devices.

It is a further object of the invention to improve the tape structure in the automatic assembly of semiconductor devices in which the tape fingers are bonded to a secondary structure.

It is a still further object of the invention to improve the performance of the outer lead bonding operation where the tape fingers are bonded to a secondary structure in the automatic tape assembly of semiconductor devices.

These and other objects are achieved as follows. In an automatic semiconductor device assembly tape a succession of metal finger patterns are created. Each pattern has a plurality of fingers that extend inwardly to terminate in an array that mates with the contact pad pattern on a semiconductor device. The fingers are thermocompression bonded to the contact pads preferably by gang bonding. This associates the semiconductor device with the tape. Then the tape is run through a process wherein the metal fingers are excised from the tape and the semiconductor device with its associated fingers bonded to a secondary structure by way of the outer finger portions. This operation too is preferably by thermocompression gang bonding. The invention resides in an improved tape configuration which includes a ring that joins the fingers into a unitary structure and immobilizes them. The ring is located at or close to the region of the fingers that are bonded to the secondary lead structure. After the fingers are bonded the ring is severed between the fingers so that they are no longer joined together. This can be done by a knife blade being pressed against the ring segments between fingers so that the segments are severed and the ends pushed apart. Alternatively, the segments can be severed at two points. If desired, the ring can be weakened at those points where it is to be severed.

BRIEF DESCRIPTION OF THE DRAWING

FIG. 1 is a fragment of all metal assembly tape showing a finger pattern and a ring that joins them into a unitary structure;

FIG. 2 is a cross section of the tape of FIG. 1 after it is bonded to a secondary lead structure;

FIG. 3 is a cross section of the structure of FIG. 2 after the ring shown in FIG. 1 is severed;

FIG. 4 is a fragment of tape showing an alternative ring structure to the one shown in FIG. 1; and FIG. 5 is a fragment of a composite metal-insulator tape.

DESCRIPTION OF THE INVENTION

FIG. 1 shows a fragment of assembly tape 12 of the all metal variety that would be used in automatic semiconductor device assembly. Typically such a tape is about 7/16 inch across and one set of fingers is shown. The pattern is repeated at regular intervals along tape 12 is transported and indexed by holes 10 along the tape edges.

In the metal finger pattern the inner ends are in registry with the bonding pads (not shown) on semiconductor device chip 11. Basically, the tape is run from a reel on an assembly machine wherein the tape fingers are bonded to chip 11 preferably using thermocompression (TC) gang bonding. This associates chip 11 with the tape which can be reeled up as it exits from the bonding machine. The assembly is as shown in FIG. 1.

The tape finger patterns are constructed so that the outer ends mate with a secondary structure that will interconnect with chip 11 and will ultimately serve the function of exterior leads in the packaged device. Such a secondary structure is fully disclosed in my copending application Ser. No. 138,030 filed Apr. 7, 1980.

In the next assembly step the finger pattern including the chip 11 is excised from tape 12 at the lines indicated at 36. The invention lies in the ring indicated at 37 which joins all of the fingers 35 into a unitary structure. After the fingers are excised from the tape at line 36, ring 37 keeps the assembly intact and prevents the fingers from being deformed. Such deformation was a problem in prior art structures in that when the outer finger ends were to be bonded to a secondary structure. Any deformed fingers could interfere with machine operation. Typically, a deformed finger would result in clogging of the automatic assembly machine. This drastically slows the assembly process.

FIG. 2 is a cross section of the tape of FIG. 1 taken at line 2—2. The outer ends of tape fingers 35 are bonded at 38, preferably by TC gang bonding, to the ends of a secondary structure 39. After outer lead bonding, a knife blade 40 is used to sever the ring 37 as shown in FIG. 3. As blade 40 severs ring 37, it pushes the ends apart as shown so that the fingers 35 are now electrically independent. Blade 40 can be a single blade that sequentially severs the links of ring 37. Alternatively, a plurality of such blades can be employed to sever all of the links at stroke. The device assembly then proceeds as is well known in the prior art.

If desired, when the tape is being manufactured a weakened region at 41 can be created to make sure that the ring 37 will part at the desired location. Region 41 can be recess etched into the tape or it could be produced by crimping.

While the elements of ring 37 can be severed by a knife blade 40 as shown in FIGS. 2 and 3, it is to be understood that other methods could be employed. For example, the individual links of ring 37 could be sheared off at one or more locations. The link could be sheared off where it joins fingers 35, in which case it would be difficult to tell if the ring were ever present on the fingers.

FIG. 4 shows an alternative ring structure to that of FIG. 1. Here fingers 35 are joined into a unitary structure by tapered elements 42 that are narrowed down at the location where they are to be severed. Additionally the point of severance can include a hole 43 to make sure that the ring will part where desired.

FIG. 5 shows an alternative form of assembly tape. Here a composite tape is illustrated. A polyimide film 12' has located thereon metal finger patterns that are cantilevered over an opening in the tape. The opening is slightly larger than the excision line 36. In FIG. 5 the tape fragment is shown is representative of the equivalent of the lower right hand corner of FIG. 1. In all other respects the tape of FIG. 5 is equivalent to that of FIG. 1.

The invention has been described and illustrated. Upon reading the foregoing description, alternatives and equivalents, within the spirit and intent of the invention, will occur to a person skilled in the art. For example, while the ring is shown and described as close to the outer lead bond area, it could be closer in toward the IC chip. Furthermore, the outer bond could be made by soldering or welding. Accordingly, it intended that the scope of the invention be limited only by the follow claims.

I claim:

1. A tape for the automatic assembly of semiconductor devices having a bonding pad array that is to be interconnected with elements of a secondary lead array, said tape including a plurality of sequential metal finger patterns comprising:
   inwardly extending portions that form an array that mates with said bonding pad array;
   outwardly extending portions that form an array that mates with said secondary lead array; and
   a metal ring joining said fingers together to form a unitary structure, said ring including weakened points between said fingers.

2. The tape of claim 1 where said ring is located on said fingers at the point where they are to be bonded to said secondary lead array.

3. The tape of claim 1 wherein said ring is located on said fingers at a point inside the point where they are to be bonded to said secondary lead array.

4. The tape of claim 1 in combination with said semiconductor device.

5. The tape of claim 4 in combination with said secondary lead array.

6. A tape process for assembling semiconductor devices wherein said tape includes a series of sequential metal finger patterns, each pattern including a plurality of fingers extending inwardly to form an array that mates with the contact pattern of a semiconductor device, said fingers also extending outwardly to form an array that mates with a secondary lead pattern that will serve to connect said semiconductor device to external circuitry, said process including the steps of:
   forming a ring of metal integral with said fingers to join said fingers into a unitary structure;
   thinning said ring at points intermediate between said fingers;
   bonding said fingers to said semiconductor device;
   excising said fingers from said tape at a location outside said ring;
   bonding said fingers to said secondary lead pattern;
   then severing said ring at said thinned points between said fingers; and lastly,
   encapsulating said semiconductor device along with said fingers and portions of said secondary lead pattern.

7. The process of claim 1 wherein said tape is of all metal construction.

8. The process of claim 6 wherein said tape is of composite construction including an insulating backing with metal portions including said finger patterns located thereon.

9. The process of claim 6 wherein said severing is achieved by pressing a knife blade against said ring and using said secondary lead pattern as a backing for said knife blade.

* * * * *